(12) United States Patent
Zeng et al.

(10) Patent No.: US 11,320,933 B2
(45) Date of Patent: May 3, 2022

(54) TOUCH PANEL, TOUCH DISPLAY SCREEN AND DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Qin Zeng, Beijing (CN); Taofeng Xie, Beijing (CN); Wei Zhang, Beijing (CN); Zhao Dong, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 91 days.

(21) Appl. No.: 16/867,589

(22) Filed: May 6, 2020

(65) Prior Publication Data
US 2021/0064210 A1    Mar. 4, 2021

(30) Foreign Application Priority Data
Aug. 30, 2019    (CN) .......................... 201910814887.0

(51) Int. Cl.
*G06F 3/044* (2006.01)
*G06F 3/041* (2006.01)
*H01L 27/32* (2006.01)

(52) U.S. Cl.
CPC .......... *G06F 3/04164* (2019.05); *G06F 3/044* (2013.01); *H01L 27/323* (2013.01); *G06F 2203/04107* (2013.01)

(58) Field of Classification Search
CPC ................. G06F 3/04164; G06F 3/044; G06F 2203/04107; G06F 3/041; G06F 3/0412; H01L 27/323
See application file for complete search history.

(56) References Cited

U.S. PATENT DOCUMENTS

| | | | |
|---|---|---|---|
| 10,928,936 B2* | 2/2021 | Xu | G06F 3/041 |
| 2011/0261010 A1* | 10/2011 | Nishitani | G06F 3/0445 345/174 |
| 2011/0316803 A1* | 12/2011 | Kim | G06F 3/044 345/173 |
| 2012/0075214 A1* | 3/2012 | Kim | G06F 3/041 345/173 |
| 2013/0321304 A1* | 12/2013 | Wang | G06F 3/041 345/173 |
| 2015/0002758 A1* | 1/2015 | Chu | G06F 3/041 349/12 |
| 2015/0268794 A1* | 9/2015 | Yang | G06F 3/04184 345/174 |

FOREIGN PATENT DOCUMENTS

CN    105759525 A  *  7/2016

\* cited by examiner

*Primary Examiner* — Carolyn R Edwards
(74) *Attorney, Agent, or Firm* — Fay Sharpe LLP

(57) ABSTRACT

The present disclosure provides a touch panel, a touch display screen, and a display apparatus. The touch panel includes a base substrate, a touch structure disposed on the base substrate, at least one shielding conductive plate, and a shielding trace connected to the at least one shielding conductive plate. An orthographic projection of an electrode control line in the touch structure on the base substrate overlaps an orthographic projection of the shielding conductive plate on the base substrate.

16 Claims, 5 Drawing Sheets

TOUCH PANEL, TOUCH DISPLAY SCREEN AND DISPLAY APPARATUS

The present disclosure claims the priority of Chinese Patent Application No. 201910814887.0, filed on Aug. 30, 2019 and entitled "TOUCH PANEL, TOUCH DISPLAY SCREEN AND DISPLAY APPARATUS", which is incorporated herein by reference in its entirety.

TECHNICAL FIELD

The present disclosure relates to the field of electronic devices, and more particularly to a touch panel, a touch display screen, and a display apparatus.

BACKGROUND

A touch display screen is a display screen having a touch function, and generally includes a display panel, and a touch panel disposed on the display panel. The display panel and the touch panel both include a display region and a non-display region. However, an edge of the touch panel is easy to be interfered by an external environment.

At present, the non-display region of the touch panel is generally provided with a dummy grid shielding layer configured to shield the interference from the external environment at the edge of the touch screen.

SUMMARY

The present disclosure provides a touch panel, a touch display screen, and a display apparatus.

In one aspect, a touch panel is provided. The touch panel includes a base substrate, a touch structure disposed on the base substrate, at least one shielding conductive plate, and a shielding trace connected to the at least one shielding conductive plate; wherein the touch panel is provided with a display region and a non-display region; the touch structure includes a first electrode pattern disposed in the display region, and a plurality of electrode control lines disposed in the non-display region, the first electrode pattern being electrically connected to the plurality of electrode control lines; and the at least one shielding conductive plate and the shielding trace are both insulated from the first electrode pattern, and are both disposed in the non-display region, and an orthographic projections of the at least one shielding conductive plate on the base substrate overlaps orthographic projections of the plurality of electrode control lines on the base substrate.

Optionally, in the plurality of electrode control lines, the electrode control lines except a longest electrode control line are in one-to-one correspondence with the at least one shielding conductive plate, and the orthographic projection of each shielding conductive plate on the base substrate overlaps the orthographic projection of the corresponding electrode control line on the base substrate.

Optionally, an area of the orthographic projection of a first shielding conductive plate of the at least one shielding conductive plate on the base substrate satisfies the formula:

$$y=(m-n)*s,$$

wherein y is the area of the orthographic projection of the first shielding conductive plate on the base substrate, m is the number of intersection points between the orthographic projection of the longest electrode control line of the plurality of electrode control lines on the base substrate and an orthographic projection of the shielding trace on the base substrate, n is the number of intersection points between the orthographic projection of the electrode control line corresponding to the first shielding conductive plate on the base substrate and the orthographic projection of the shielding trace on the base substrate, and s is an average overlapping area of a plurality of overlapping regions between the orthographic projections of the plurality of electrode control lines on the base substrate and the orthographic projection of the shielding trace on the base substrate.

Optionally, a second shielding conductive plate of the at least one shielding conductive plate is in a rectangular shape; and the orthographic projection of the second shielding conductive plate on the base substrate overlaps the orthographic projection of a first electrode control line of the plurality of electrode control lines on the base substrate; and an overlapping region includes a line segment in parallel with a long side of a first shielding conductive plate.

Optionally, a third shielding conductive plate of the at least one shielding conductive plate is in an elliptic shape; and an orthographic projection of the third shielding conductive plate on the base substrate overlaps an orthographic projection of a second electrode control line of the plurality of electrode control lines on the base substrate; and an overlapping region includes a line segment in parallel with a long axis of the orthographic projection of the third shielding conductive plate on the base substrate.

Optionally, the number of shielding conductive plates is at least two; and a spacing between centers of any two shielding conductive plates of the at least two shielding conductive plates is greater than a spacing threshold value.

Optionally, the touch structure includes a second electrode pattern including a first sub-pattern disposed in the display region, and the shielding trace disposed in the non-display region; wherein an orthographic projection of the first sub-pattern on the base substrate overlaps an orthographic projection of the first electrode pattern on the base substrate.

Optionally, the shielding trace and the first sub-pattern are made by the same patterning process.

Optionally, the shielding conductive plate and the first sub-pattern are made of the same material.

Optionally, the shielding conductive plate is made of an alloy.

Optionally, the shielding conductive plate is made of aluminum.

Optionally, the shielding conductive plate and the shielding trace are made by the same patterning process.

Optionally, when the number of shielding conductive plates is at least two, the at least two shielding conductive plates and the plurality of electrode control lines form capacitors therebetween, wherein a difference between a capacitance of each of the capacitors and a standard capacitance value is less than a capacitance threshold value.

Optionally, the standard capacitance value is 4 picofarads, and the capacitance threshold value is 0.2 picofarads.

Optionally, in the plurality of electrode control lines, the electrode control lines except a longest electrode control line are in one-to-one correspondence with the at least one shielding conductive plate, and the orthographic projection of each shielding conductive plate on the base substrate overlaps the orthographic projection of the corresponding electrode control line on the base substrate;

the number of shielding conductive plates is at least two, a spacing between the centers of any two shielding conductive plates of the at least two shielding conductive plates is greater than a spacing threshold value;

an area of the orthographic projection of a first shielding conductive plate of the at least two shielding conductive plates on the base substrate satisfies the formula:

$$y=(m-n)*s,$$

wherein y is the area of the orthographic projection of the first shielding conductive plate on the base substrate, m is the number of intersection points between the orthographic projection of the longest electrode control line of the plurality of electrode control lines on the base substrate and an orthographic projection of the shielding trace on the base substrate, n is the number of intersection points between the orthographic projection of the electrode control line corresponding to the first shielding conductive plate on the base substrate and the orthographic projection of the shielding trace on the base substrate, and s is an average overlapping area of a plurality of overlapping regions between the orthographic projections of the plurality of electrode control lines on the base substrate and the orthographic projection of the shielding trace on the base substrate; and a second shielding conductive plate of the at least two shielding conductive plates is in a rectangular shape, the orthographic projection of the second shielding conductive plate on the base substrate overlaps the orthographic projection of a first electrode control line of the plurality of electrode control lines on the base substrate, and an overlapping region includes a line segment in parallel with a long side of the first shielding conductive plate.

In another aspect, a touch display screen is provided. The touch display screen includes a display panel and a touch panel. The touch panel includes a base substrate, at least one shielding conductive plate, and a shielding trace connected to the at least one shielding conductive plate; the touch panel is provided with a display region and a non-display region; and a touch structure includes a first electrode pattern disposed in the display region, and a plurality of electrode control lines disposed in the non-display region; wherein the first electrode pattern is electrically connected to the plurality of electrode control lines, the at least one shielding conductive plate and the shielding trace are both insulated from the first electrode pattern, and are both disposed in the non-display region, and an orthographic projection of the at least one shielding conductive plate on the base substrate overlaps orthographic projections of the plurality of electrode control lines on the base substrate; and the display panel is provided with a display region and a non-display region; wherein an orthographic projection of the display region of the display panel on the touch panel falls within the display region of the touch panel, and an orthographic projection of the non-display region of the display panel on the touch panel falls within the non-display region of the touch panel.

In another aspect, a display apparatus is provided. The display apparatus includes a touch display screen. The touch display screen includes a display panel and a touch panel; wherein the touch panel includes a base substrate, a touch structure disposed on the base substrate, at least one shielding conductive plate, and a shielding trace connected to the at least one shielding conductive plate; the touch panel is provided with a display region and a non-display region; and the touch structure includes a first electrode pattern disposed in the display region, and a plurality of electrode control lines disposed in the non-display region; wherein the first electrode pattern is electrically connected to the plurality of electrode control lines, the at least one shielding conductive plate and the shielding trace are both insulated from the first electrode pattern and are both disposed in the non-display region, and an orthographic projection of the at least one shielding conductive plate on the base substrate overlaps orthographic projections of the plurality of electrode control lines on the base substrate; and the display panel is provided with a display region and a non-display region; wherein an orthographic projection of the display region of the display panel on the touch panel falls within the display region of the touch panel, and an orthographic projection of the non-display region of the display panel on the touch panel falls within the non-display region of the touch panel.

DETAILED DESCRIPTION

The embodiments of the present disclosure are described hereafter in combination with the drawings.

At present, in order to implement a narrow side frame screen, a patterned touch electrode grid is generally adopted as a touch electrode in a touch panel of a narrow side frame touch display screen; such a patterned touch electrode grid is called as a touch electrode pattern; each pattern channel in the pattern consists of metal grids of multiple minimum pitches which are cut in a predetermined manner; and a plurality of pattern channels form the entire pattern. Furthermore, an electrode control line is disposed in a non-display region at the edge of the touch panel; the electrode control line is electrically connected to the touch electrode pattern, and is used to supply power to the touch electrode pattern. In a relevant touch panel of the narrow side frame touch display screen, the touch electrode pattern only covers a display region; and neither the touch electrode pattern nor a Dummy grid shielding layer, which is often disposed in a conventional non-narrow side frame screen, can be disposed in the non-display region at the edge. Therefore, the capacitance values in the non-display region of the touch panel are small and are distributed non-uniformly, thus the existing narrow side frame touch display screen has a poor anti-interference capability at edge positions. Furthermore, a correlative person will debug a control integrated circuit (IC) of the touch electrode and set an IC control parameter to realize the touch function. For the touch panel the edge capacitance values of which are distributed non-uniformly, the capacitors at all the positions at the edge need to be measured one by one when debugging the control IC, thus having a high the debugging difficulty.

Figure 1:
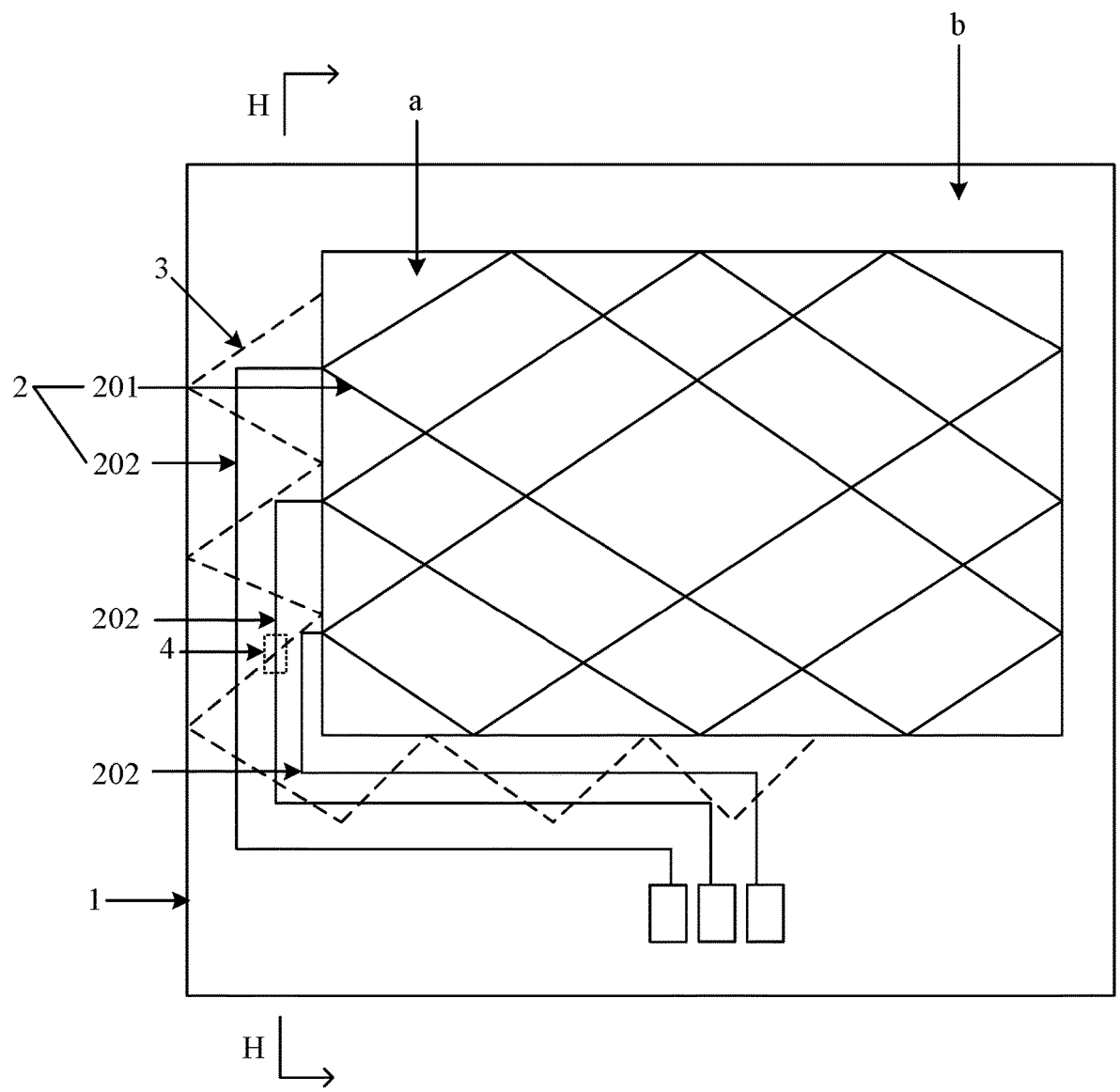
FIG. 1 is a plan view of a touch panel according to an embodiment of the present disclosure.

The present disclosure provides a touch panel, touch display screen and display apparatus, and the content is as follows:

An embodiment of the present disclosure provides a touch panel. As shown in FIG. 1, the touch panel comprises a base substrate 1, a touch structure 2 disposed on the base substrate 1, at least one shielding conductive plate 4, and a shielding trace 3, wherein the at least one shielding conductive plate 4 is connected to the shielding trace 3.

The touch panel is provided with a display region a and a non-display region b. The touch structure 2 includes a first electrode pattern 201 disposed in the display region a, and a plurality of electrode control lines 202 disposed in the non-display region b. The first electrode pattern 201 is electrically connected to the plurality of electrode control lines 202. The plurality of electrode control lines 202 may be configured to control the first electrode pattern 201 to implement a touch function.

The at least one shielding conductive plate 4 and the shielding trace 3 are disposed in the non-display region b, and are both insulated from the first electrode pattern 201. The shielding trace 3 is provided thereon with at least one shielding conductive plate 4. An orthographic projections of the at least one shielding conductive plate 4 on the base substrate 1 overlaps orthographic projections of the plurality of electrode control lines 202 on the base substrate 1.

In the embodiments of the present application, the term "overlap" may refer to at least partially overlapping, namely, partially overlapping and completely overlapping. For example, that the orthographic projection of the at least one shielding conductive plate 4 on the base substrate 1 overlaps the orthographic projections of the plurality of electrode control lines 202 on the base substrate 1 may mean that the orthographic projection of the at least one shielding conductive plate 4 on the base substrate 1 completely overlaps the orthographic projections of the plurality of electrode control lines 202 on the base substrate 1, and may also mean that the orthographic projection of the at least one shielding conductive plate 4 on the base substrate 1 partially overlaps the orthographic projections of the plurality of electrode control lines 202 on the base substrate 1.

In FIG. 1, for clearer description, the shielding trace 3 and the shielding conductive plates 4 which are disposed on a different layer from the electrode control lines 202 are denoted with dotted lines.

The technical solution of the present disclosure at least has the following beneficial effects:

The shielding trace and the shielding conductive plates are disposed in a peripheral region of the touch panel; furthermore, the shielding trace and the shielding conductive plates may overlap the electrode control lines, such that the capacitance of the non-display region at an edge of the touch panel may be improved by forming capacitors between the shielding trace, the shielding conductive plates and the electrode control lines, such that the anti-interference capability at the edge of the touch panel is improved.

An embodiment of the present disclosure provides a touch panel. As shown in FIG. 1, the touch panel includes a base substrate 1, a touch structure 2 disposed on the base substrate 1, at least one shielding conductive plate 4, and a shielding trace 3.

The touch panel is provided with a display region a and a non-display region b. The display region of the touch panel may correspond to the display region of the display panel. The correspondence may refer to a case where an orthographic projection of the display region of the display panel on the touch panel falls within the display region of the touch panel. Correspondingly, the non-display region of the touch panel may correspond to the non-display region of the display panel. The correspondence may refer to a case where an orthographic projection of the non-display region of the display panel on the touch panel falls within the non-display region of the touch panel.

The touch structure 2 includes a first electrode pattern 201 disposed in the display region a, and a plurality of electrode control lines 202 disposed in the non-display region. The first electrode pattern 201 is electrically connected to the plurality of electrode control lines 202.

The first electrode pattern 201 is configured to determine a touch position of a user according to changes of a capacitance, to implement a touch function. The shielding trace 3 is configured to cooperate with the electrode control lines 202 and the shielding conductive plates 4 to improve the anti-interference capability at the edge of the touch panel, and thus achieves the effect of shielding external interference.

The orthographic projection of the at least one shielding conductive plate 4 on the base substrate 1 overlaps the orthographic projections of the plurality of electrode control lines 202 on the base substrate 1.

Figure 2:
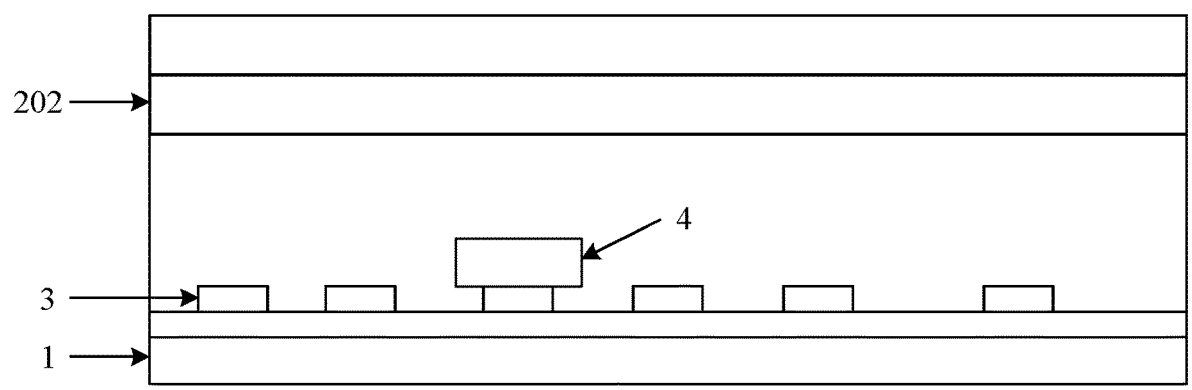
FIG. 2 is a schematic sectional view of a touch panel according to an embodiment of the present disclosure.

FIG. 2 is a sectional view of a touch panel at a position H-H as shown in FIG. 1. The shielding trace 3 is provided thereon with at least one shielding conductive plate 4; the orthographic projection of the at least one shielding conductive plate 4 on the base substrate 1 overlaps the orthographic projections of the electrode control lines 202 on the base substrate 1. On the basis of a parallel plate capacitor principle, the at least one shielding conductive plate 4 may improve the capacitances of the capacitors between the shielding trace 3 and the electrode control lines 202, thereby improving the anti-interference capability.

In one optional embodiment, in the plurality of electrode control lines 202, the electrode control lines 202 except a longest electrode control line 202 are in one-to-one correspondence with the at least one shielding conductive plate 4; and the orthographic projection of each shielding conductive plate 4 on the base substrate 1 overlaps the orthographic projection of the corresponding electrode control line 202 on the base substrate 1.

It can be understood that the longest electrode control line 202 and the shielding trace 3 have the most interaction points, and a single line has the greatest sum of overlapping areas. According to the parallel plate capacitor principle, the longest electrode control line 3 has a greatest sum of capacitances, and the capacitance may satisfy a shielding requirement without configuring a shielding conductive plate 4 at a position corresponding to the longest electrode control line 3. Except the longest electrode control line 3, each of the other electrode control lines 3 may correspond to a shielding conductive plate 4.

It can be understood that except the longest electrode control line 3, each of the other electrode control lines 3 may correspond to a shielding conductive plate 4, and the shielding conductive plate 4 corresponding to each electrode control line 3 is disposed at an overlapping position between the electrode control line 3 and the shielding trace 202.

An area of the orthographic projection of a first shielding conductive plate 4 of the at least one shielding conductive plate 4 on the base substrate 1 satisfies the formula: $y=(m-n)*s$, wherein y is the area of the orthographic projection, m is the number of intersection points between the orthographic projection of the longest electrode control line 202 of the plurality of electrode control lines 202 on the base substrate 1 and the orthographic projection of the shielding trace 3 on the base substrate 1, n is the number of intersection points between the orthographic projection of the electrode control line 3 corresponding to the first shielding conductive plate 4 on the base substrate 1 and an orthographic projection of the shielding trace 3 on which the first shielding conductive plate is disposed on the base substrate 1, and s is an average overlapping area of a plurality of overlapping regions between the orthographic projections of the plurality of electrode control lines 202 on the base substrate 1 and the orthographic projection of the shielding trace 3 on the base substrate 1.

The capacitors formed between the electrode control lines 202, the shielding conductive plates 4 and the shielding trace 3 satisfy the parallel plate capacitor principle; the more the number of intersection points between one electrode control line 202 and the shielding trace 3, the greater the sum of corresponding overlapping areas, the greater the capacitance, and thus the stronger the anti-interference capability. On the contrary, the less the number of intersection points between one electrode control line 202 and the shielding trace 3 is, the less the sum of corresponding overlapping areas, the smaller the capacitance, and the weaker the anti-interference capability. For improvement of the anti-interference capability, corresponding shielding conductive plates 4 may be configured for the electrode control lines except the longest electrode control line. Furthermore, the areas of the shielding conductive plates 4 are correlated to the number of intersection points between the electrode control line and the shielding trace. The greater the number of intersection points is, the smaller the area of the shielding conductive plate 4; and the less the number of intersection points, the greater the area of the shielding conductive plate 4. Therefore, the capacitance distribution uniformity degree is improved. The specific correlation relationship is denoted by the formula $y=(m-n)*s$.

The overlapping area between the shielding conductive plate 4 and the electrode control line 202 is proportional to the anti-interference capability; and the overlapping area between the shielding trace 3 and the electrode control line 202 is also proportional to the anti-interference capability. Thickening the electrode control lines 202 or the shielding trace 3 to improve the anti-interference capability is not applicable to a narrow side frame screen. Therefore, the shielding conductive plate 4 may be configured in an appropriate shape, to improve the overlapping area as much as possible. The shielding conductive plate 4 may be in a rectangular shape or an elliptic shape, and may also be in other shapes.

Figure 3:
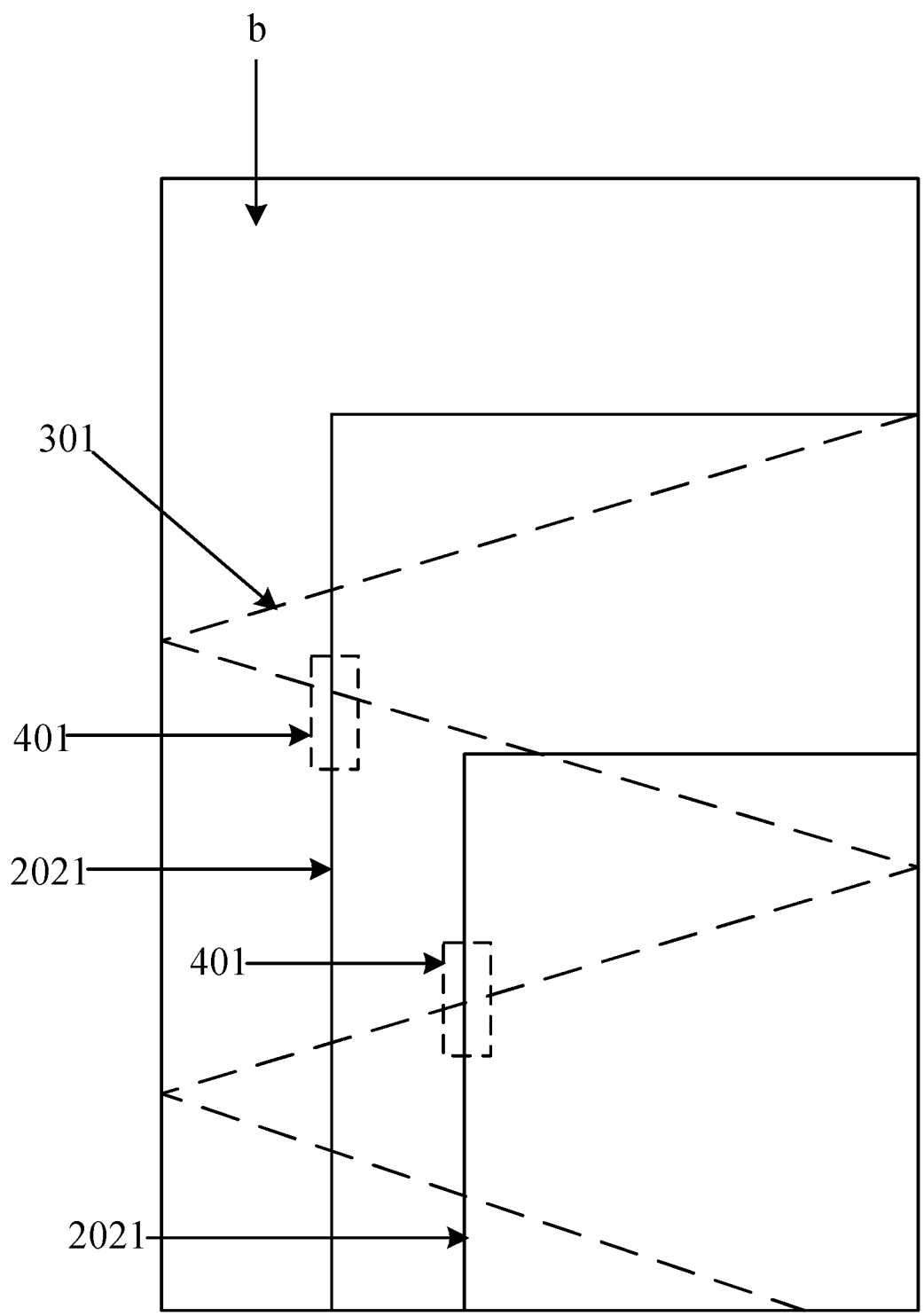
FIG. 3 is a schematic view of a second shielding conductive plate according to an embodiment of the present disclosure.

In one optional embodiment, as shown in FIG. 3, a second shielding conductive plate of the at least one shielding conductive plate 4 is in a rectangular shape. The at least one shielding conductive plate may include at least one second shielding conductive plate 401.

The orthographic projection of the second shielding conductive plate 401 on the base substrate 1 overlaps the orthographic projection of a first electrode control line 2021 of the plurality of electrode control lines on the base substrate 1; and an overlapping region includes a line segment in parallel with a long side of the first shielding conductive plate. In one embodiment, the overlapping region includes the long side of the first shielding conductive plate.

The long side of the orthographic projection of the second shielding conductive plate 401 on the base substrate 1 is in parallel with the length direction of the orthographic projection of the overlapped first electrode control line 2021 on the base substrate 1. Therefore, the overlapping area between the second shielding conductive plate 401 and the first electrode control line 2021 may be increased to improve the capacitance value, so as to improve the anti-interference capability.

Figure 4:
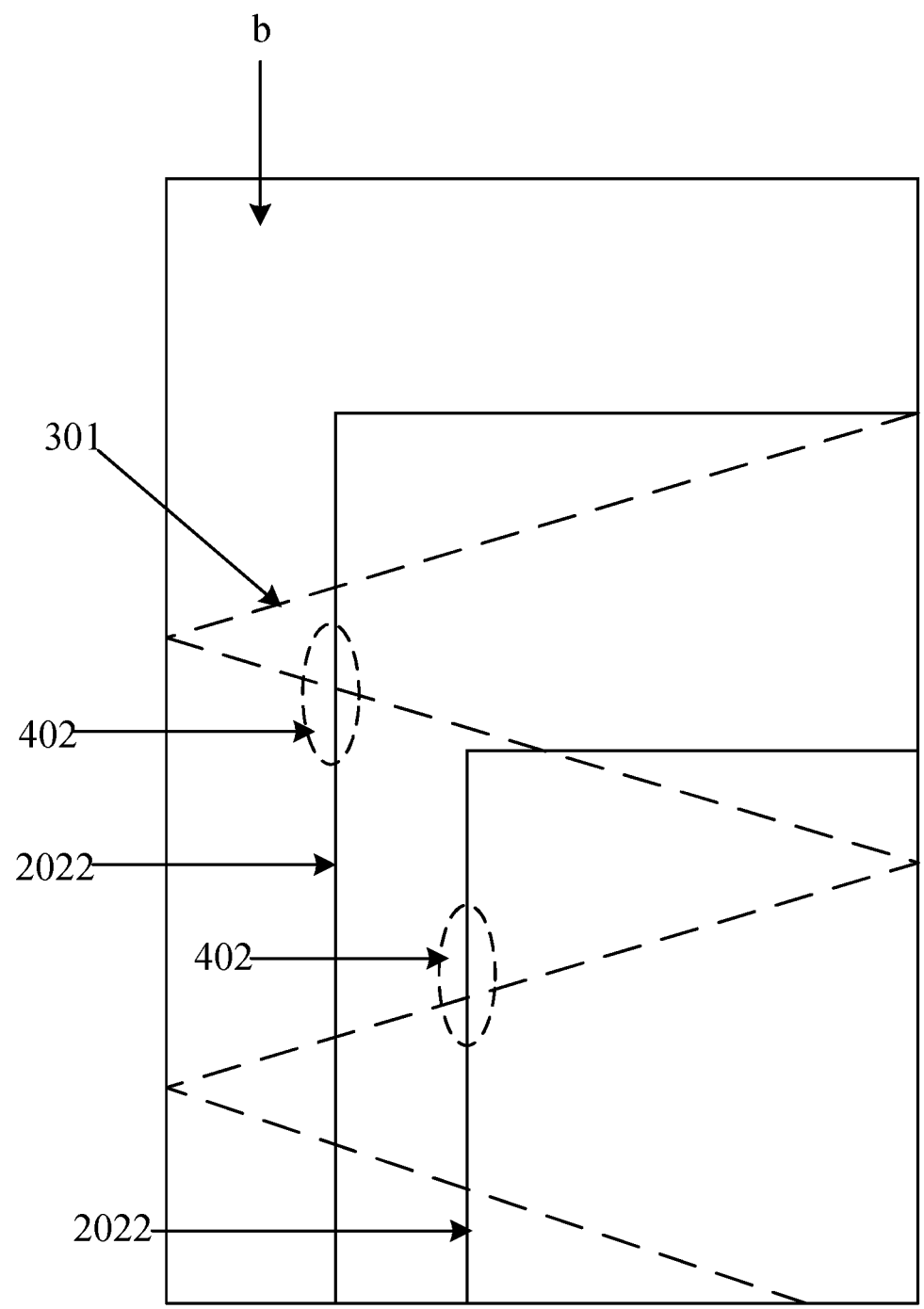
FIG. 4 is a schematic view of a third shielding conductive plate according to an embodiment of the present disclosure.

In one optional embodiment, as shown in FIG. 4, a third shielding conductive plate 402 of the at least one shielding conductive plate 4 is in an elliptic shape. The at least one shielding conductive plate may include at least one third shielding conductive plate 402.

The orthographic projection of the third shielding conductive plate 402 on the base substrate 1 overlaps the orthographic projection of a second electrode control line 2022 of the plurality of electrode control lines on the base substrate; and an overlapping region includes a line segment in parallel with a long axis of the orthographic projection of the third shielding conductive plate 402 on the base substrate 1. In one embodiment, the overlapping region may include the long axis of the orthographic projection of the third shielding conductive plate 402 on the base substrate 1.

The long side of the orthographic projection of the third shielding conductive plate 402 on the base substrate 1 is in parallel with a lengthwise direction of the orthographic projection of the overlapped second electrode control line 2022 on the base substrate 1. Therefore, the overlapping area between the third shielding conductive plate 402 and the second electrode control line 2022 may be increased to improve the capacitance, so as to improve the anti-interference capability.

In one optional embodiment, the number of shielding conductive plates 4 is at least two.

A spacing between centers of any two shielding conductive plates 4 of the at least two shielding conductive plates 4 is greater than a spacing threshold value. For example, the center may be a geometric center or a center of gravity.

It may be understood that the spacing between the centers of two shielding conductive plates 4 is greater than the spacing threshold value, such that the situation that the capacitances are distributed non-uniformly because the shielding conductive plates 4 are stockpiled at a certain position is avoided, thereby improving the capacitance distribution uniformity.

FIG. 2 shows a situation where the shielding conductive plate 4 and the shielding trace 3 are made by two separate patterning processes.

Figure 5:
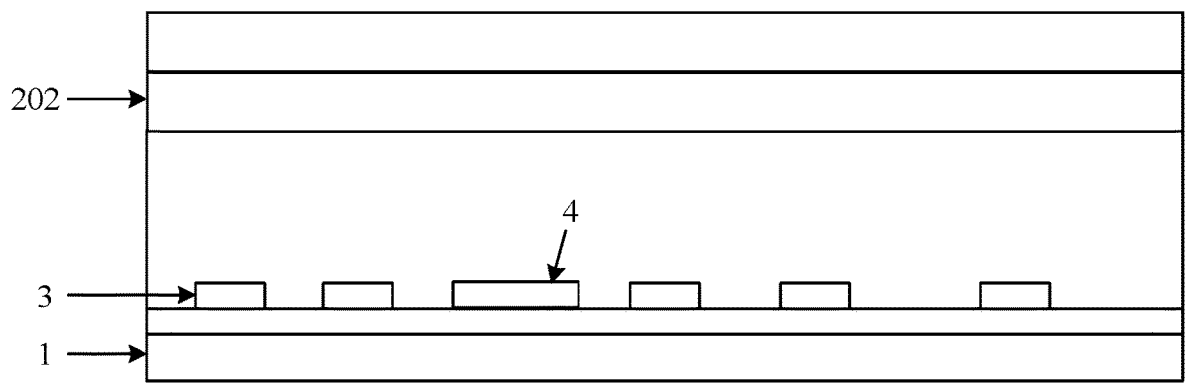
FIG. 5 is a cross-sectional view of a touch panel according to an embodiment of the present disclosure.

In one optional embodiment, as shown in FIG. 5, the shielding conductive plate 4 and the shielding trace 3 are made by the same patterning process. Therefore, the patterning processes may be reduced by one, thereby reducing the manufacturing cost.

Figure 6:
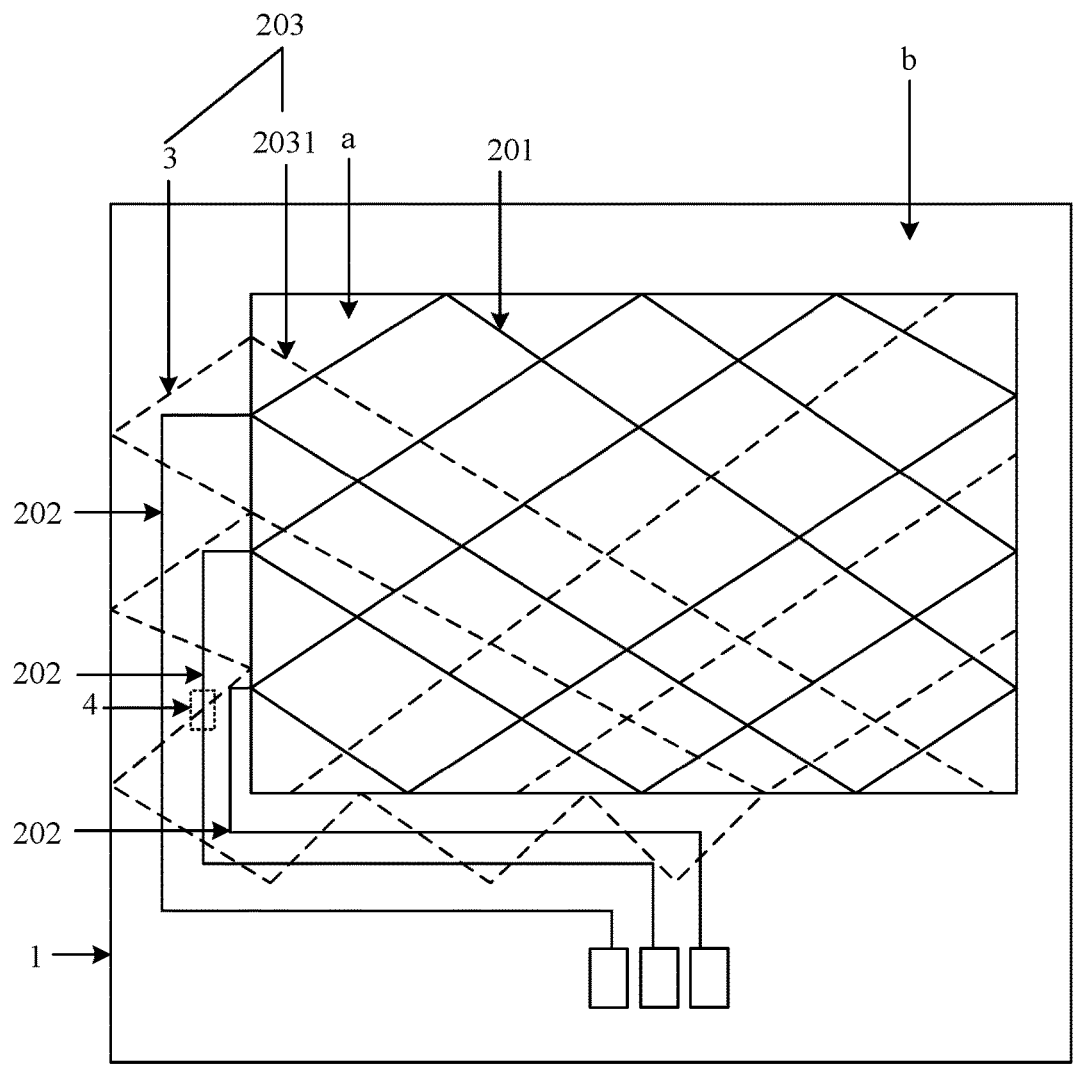
FIG. 6 is a plan view of another touch panel according to an embodiment of the present disclosure.

In one optional embodiment, as shown in FIG. 6, the touch structure includes a second electrode pattern 203. The second electrode pattern 203 includes a first sub-pattern 2031 disposed in the display region a, and the shielding trace 3 disposed in the non-display region b. An orthographic projection of the first sub-pattern 2031 on the base substrate 1 overlaps an orthographic projection of the first electrode pattern 201 on the base substrate. Therefore, the touch function may be implemented by a double-layer electrode structure including the first sub-pattern 2031 and the first electrode pattern 201. The shielding trace 3 may be a grid-shaped trace, such that the shielding trace 3 may also implement the touch function, thereby achieving the effect that the edges of the display panel may also implement the touch function.

In one optional embodiment, the shielding trace 3 and the first sub-pattern 2031 are made by the same patterning process. Therefore, the patterning processes may be reduced by one, thereby reducing the manufacturing cost. In one optional embodiment, the shielding conductive plate 4 and the first sub-pattern 2031 are made of the same material.

The shielding conductive plate 4 and the first sub-pattern 2031 are made of the same material, thereby reducing manufacturing complexity.

In one optional embodiment, the shielding conductive plates 4 are all made of an alloy or aluminum.

The shielding conductive plates 4 are made of an alloy or aluminum, thereby enabling the touch panel to be lighter and thinner while conductivity is ensured.

In one optional embodiment, when the number of shielding conductive plates is at least two, the at least two of the shielding conductive plates 4 and the plurality of electrode control lines 202 form a plurality of capacitors therebetween, wherein differences between the capacitances of the capacitors and a standard capacitance value are all less than a capacitance threshold value.

Each shielding conductive plate 4 may form a capacitor together with the electrode control line. The differences between the capacitance of the capacitors formed in such a fashion and the standard capacitance value are all less than the capacitance threshold value, such that the uniformity of the capacitors is ensured. During debugging and calibration, only the capacitors at a certain position at an edge need to be measured, and then the capacitors at other positions at the edge may be inferred without measuring all the capacitors at the edge, thereby reducing debugging difficulties.

In one optional embodiment, the standard capacitance value is 4 picofarads, and the capacitance threshold value is 0.2 picofarads.

An embodiment of the present disclosure provides a touch display screen. The touch display screen includes a display panel and the touch panel according to the above embodiment.

The display panel includes a display region and a non-display region. The display region of the display panel corresponds to the display region of the touch panel, that is, an orthographic projection of the display region of the display panel on the touch panel falls within the display region of the touch panel. The non-display region of the display panel corresponds to the non-display region of the touch panel, that is, an orthographic projection of the non-display region of the display panel on the touch panel falls within the non-display region of the touch panel.

The display region of the display panel refers to a region in which pixels and a light emitting device are disposed, and the non-display region refers to a region in which no pixel and light emitting device are disposed.

An embodiment of the present disclosure provides a display apparatus. The display apparatus includes the touch display screen disclosed above.

In summary, the technical solution of the present disclosure at least achieves the following beneficial effects:

The shielding trace and the shielding conductive plates are disposed in a peripheral region of the touch panel; furthermore, the shielding trace and the shielding conductive plates can be overlapped with the electrode control lines, such that the capacitance value of the non-display region at the edge of the touch panel can be improved by forming the capacitors between the shielding trace, the shielding conductive plates and the electrode control lines, thereby improving the anti-interference capability at the edge of the touch panel.

In a first aspect, a touch panel is provided. The touch panel includes a base substrate, and a touch electrode pattern and a plurality of electrode control lines which are disposed on the base substrate, wherein the touch electrode pattern and the plurality of electrode control lines are connected to each other.

The touch panel includes a display region and a non-display region.

The touch electrode pattern includes a plurality of touch traces disposed in the display region, and a plurality of shielding traces disposed in the non-display region.

Orthographic projections of the shielding traces on the base substrate and orthographic projections of the plurality of electrode control lines on the base substrate have an overlapping region; the plurality of shielding traces are provided thereon with at least one shielding metal plate; and an orthographic projection of the at least one shielding metal plate on the base substrate overlaps the overlapping region.

Optionally, the at least one shielding metal plate is in one-to-one correspondence with the electrode control lines except a longest electrode control line in the plurality of electrode control lines.

Optionally, each shielding metal plate is disposed at an overlapping portion between the shielding trace and the corresponding electrode control line.

Optionally, an area of the orthographic projection of the shielding metal plate on the base substrate satisfies the formula: $y=(m-n)*s$, wherein y is the area of the orthographic projection; m is the number of intersection points between the longest electrode control line of the plurality of electrode control lines and the plurality of shielding traces, n is the number of intersection points between the electrode control lines corresponding to the shielding metal plates and the shielding traces, and s is an average overlapping area of all the overlapping portions between the plurality of electrode control lines and the shielding traces.

Optionally, the shielding metal plate is a rectangular shielding metal plate.

The orthographic projection of a first shielding metal plate of the at least one shielding metal plate on the base substrate overlaps the orthographic projection of the first electrode control line of the plurality of electrode control lines on the base substrate; and a long side of the orthographic projection of the first shielding metal plate on the base substrate is in parallel with the length direction of the orthographic projection of the overlapped first electrode control line on the base substrate.

Optionally, the shielding metal plate is an elliptic shielding metal plate.

The orthographic projection of a second shielding metal plate of the at least one shielding metal plate on the base substrate overlaps the orthographic projection of the second electrode control line of the plurality of electrode control lines on the base substrate; and a long side of the orthographic projection of the second shielding metal plate on the base substrate is in parallel with the length direction of the orthographic projection of the overlapped second electrode control line on the base substrate.

Optionally, the number of shielding metal plates is at least two.

A spacing between centers of any two shielding metal plates of the at least two shielding metal plates is greater than a first spacing threshold value.

Optionally, the shielding metal plate and the touch electrode pattern are made by the same patterning process.

Optionally, the shielding metal plate and the touch electrode pattern are made of the same material.

Optionally, the shielding metal plate and the touch electrode pattern are made of an alloy or aluminum.

Optionally, the at least one shielding metal plate, the plurality of electrode control lines and the plurality of touch traces form a plurality of capacitors therebetween, wherein differences between capacitances of the capacitors and a standard capacitance value are all less than a capacitance threshold value.

Optionally, the standard capacitance value is 4 picofarads, and the capacitance threshold value is 0.2 picofarads.

In a second aspect, a touch display screen is provided. The touch display screen includes a display panel and the touch panel in the first aspect.

The display panel includes a display region and a non-display region; wherein the display region of the display panel corresponds to the display region of the touch panel, and the non-display region of the display panel corresponds to the non-display region of the touch panel.

In a third aspect, a display apparatus is provided. The display apparatus includes the touch display screen in the second aspect.

What is claimed is:

1. A touch panel, comprising a base substrate, a touch structure located on the base substrate, at least one shielding conductive plate, and a shielding trace connected to the at least one shielding conductive plate, wherein
    the touch panel is provided with a display region and a non-display region; the touch structure comprises a first electrode pattern located in the display region, and a plurality of electrode control lines located in the non-display region, the first electrode pattern being electrically connected to the plurality of electrode control lines;
    the at least one shielding conductive plate and the shielding trace are both insulated from the first electrode pattern, and are both located in the non-display region; the orthographic projections of the at least one shielding conductive plate on the base substrate are overlapped with the orthographic projections of the plurality of electrode control lines on the base substrate;
    in the plurality of electrode control lines, the electrode control lines except the longest electrode control line are in one-to-one correspondence with the at least one shielding conductive plate; and the orthographic projection of each shielding conductive plate on the base substrate is overlapped with the orthographic projection of the corresponding electrode control line on the base substrate.

2. The touch panel according to claim 1, wherein the area of the orthographic projection of a first shielding conductive plate of the at least one shielding conductive plate on the base substrate satisfies the formula:

$$y=(m-n)*s,$$

wherein y is the area of the orthographic projection of the first shielding conductive plate on the base substrate; m is the number of intersection points between the orthographic projection of the longest electrode control line of the plurality of electrode control lines on the base substrate and the orthographic projection of the shielding trace on the base substrate; n is the number of intersection points between the orthographic projection of the electrode control line corresponding to the first shielding conductive plate on the base substrate and the orthographic projection of the shielding trace on the base substrate; and s is an average overlapping area of a plurality of overlapping regions between the orthographic projections of the plurality of electrode control lines on the base substrate and the orthographic projection of the shielding trace on the base substrate.

3. The touch panel according to claim 1, wherein a second shielding conductive plate of the at least one shielding conductive plate is in a rectangular shape;
    the orthographic projection of the second shielding conductive plate on the base substrate is overlapped with the orthographic projection of a first electrode control line of the plurality of electrode control lines on the base substrate; and the overlapping region comprises a line segment in parallel with a long side of a first shielding conductive plate.

4. The touch panel according to claim 1, wherein a third shielding conductive plate of the at least one shielding conductive plate is in an elliptic shape;
    the orthographic projection of the third shielding conductive plate on the base substrate is overlapped with the orthographic projection of a second electrode control line of the plurality of electrode control lines on the base substrate; and the overlapping region comprises a line segment in parallel with a long axis of the orthographic projection of the third shielding conductive plate on the base substrate.

5. The touch panel according to claim 1, wherein the number of the shielding conductive plates is at least two;
    the space between the centers of any two shielding conductive plates of the at least two shielding conductive plates is greater than a space threshold value.

6. The touch panel according to claim 1, wherein the touch structure comprises a second electrode pattern; the second electrode pattern comprises a first sub-pattern located in the display region, and the shielding trace located in the non-display region; and the orthographic projection of the first sub-pattern on the base substrate is overlapped with the orthographic projection of the first electrode pattern on the base substrate.

7. The touch panel according to claim 6, wherein the shielding trace and the first sub-pattern are made with the same time patterning process.

8. The touch panel according to claim 6, wherein the shielding conductive plates and the first sub-pattern are made from the same material.

9. The touch panel according to claim 8, wherein the shielding conductive plates are made from an alloy.

10. The touch panel according to claim 8, wherein the shielding conductive plates are made from aluminum.

11. The touch panel according to claim 1, wherein the shielding conductive plates and the shielding trace are made with the same time patterning process.

12. The touch panel according to claim 1, wherein when the number of the shielding conductive plates is at least two, at least two of the shielding conductive plates and the plurality of electrode control lines form capacitors therebetween, and the differences between the capacitance values of the capacitors and a standard capacitance value are all less than a capacitance threshold value.

13. The touch panel according to claim 12, wherein the standard capacitance value is 4 picofarads, and the capacitance threshold value is 0.2 picofarads.

14. The touch panel according to claim 1, wherein in the plurality of electrode control lines, the electrode control lines except the longest electrode control line are in one-to-one correspondence with the at least one shielding conductive plate; and the orthographic projection of each shielding conductive plate on the base substrate is overlapped with the orthographic projection of the corresponding electrode control line on the base substrate;

the number of the shielding conductive plates is at least two; the space between the centers of any two shielding conductive plates of the at least two shielding conductive plates is greater than a space threshold value;

the area of the orthographic projection of a first shielding conductive plate of the at least two shielding conductive plates on the base substrate satisfies the formula:

$$y=(m-n)*s,$$

wherein y is the area of the orthographic projection of the first shielding conductive plate on the base substrate; m is the number of intersection points between the orthographic projection of the longest electrode control line of the plurality of electrode control lines on the base substrate and the orthographic projection of the shielding trace on the base substrate; n is the number of intersection points between the orthographic projection of the electrode control line corresponding to the first shielding conductive plate on the base substrate and the orthographic projection of the shielding trace on the base substrate; and s is an average overlapping area of a plurality of overlapping regions between the orthographic projections of the plurality of electrode control lines on the base substrate and the orthographic projection of the shielding trace on the base substrate;

a second shielding conductive plate of the at least two shielding conductive plates is in a rectangular shape; the orthographic projection of the second shielding conductive plate on the base substrate is overlapped with the orthographic projection of a first electrode control line of the plurality of electrode control lines on the base substrate; and the overlapping region comprises a line segment in parallel with a long side of the first shielding conductive plate.

15. A touch display screen, comprising a display panel and a touch panel, wherein the touch panel comprises a base substrate, at least one shielding conductive plate, and a shielding trace connected to the at least one shielding conductive plate; the touch panel is provided with a display region and a non-display region; a touch structure comprises a first electrode pattern located in the display region, and a plurality of electrode control lines located in the non-display region; the first electrode pattern is electrically connected to the plurality of electrode control lines; the at least one shielding conductive plate and the shielding trace are both insulated from the first electrode pattern, and are both located in the non-display region; the orthographic projections of the at least one shielding conductive plate on the base substrate are overlapped with the orthographic projections of the plurality of electrode control lines on the base substrate, wherein in the plurality of electrode control lines, the electrode control lines except the longest electrode control line are in one-to-one correspondence with the at least one shielding conductive plate; and the orthographic projection of each shielding conductive plate on the base substrate is overlapped with the orthographic projection of the corresponding electrode control line on the base substrate;

the display panel is provided with a display region and a non-display region; the orthographic projection of the display region of the display panel on the touch panel is located in the display region of the touch panel; and the orthographic projection of the non-display region of the display panel on the touch panel is located in the non-display region of the touch panel.

16. A display apparatus, comprising a touch display screen, wherein the touch display screen comprises a display panel and a touch panel; the touch panel comprises a base substrate, a touch structure located on the base substrate, at least one shielding conductive plate, and a shielding trace connected to the at least one shielding conductive plate; the touch panel is provided with a display region and a non-display region; the touch structure comprises a first electrode pattern located in the display region, and a plurality of electrode control lines located in the non-display region; the first electrode pattern is electrically connected to the plurality of electrode control lines; the at least one shielding conductive plate and the shielding trace are both insulated from the first electrode pattern, and are both located in the non-display region; the orthographic projections of the at least one shielding conductive plate on the base substrate are overlapped with the orthographic projections of the plurality of electrode control lines on the base substrate, wherein in the plurality of electrode control lines, the electrode control lines except the longest electrode control line are in one-to-one correspondence with the at least one shielding conductive plate; and the orthographic projection of each shielding conductive plate on the base substrate is overlapped with the orthographic projection of the corresponding electrode control line on the base substrate;

the display panel is provided with a display region and a non-display region; the orthographic projection of the display region of the display panel on the touch panel is located in the display region of the touch panel; and the orthographic projection of the non-display region of the display panel on the touch panel is located in the non-display region of the touch panel.

* * * * *